(12) United States Patent
Yokou et al.

(10) Patent No.: US 9,411,015 B2
(45) Date of Patent: Aug. 9, 2016

(54) SEMICONDUCTOR DEVICE HAVING PENETRATING ELECTRODES EACH PENETRATING THROUGH SUBSTRATE

(71) Applicant: PS4 Luxco S.a.r.l., Luxembourg (LU)

(72) Inventors: Hideyuki Yokou, Tokyo (JP); Manabu Ishimatsu, Tokyo (JP); Naoki Ogawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 652 days.

(21) Appl. No.: 13/830,852

(22) Filed: Mar. 14, 2013

(65) Prior Publication Data

US 2013/0249578 A1   Sep. 26, 2013

(30) Foreign Application Priority Data

Mar. 23, 2012 (JP) .................................. 2012-066750

(51) Int. Cl.
| | | |
|---|---|---|
| *H01L 29/40* | (2006.01) | |
| *G01R 31/3187* | (2006.01) | |
| *G11C 5/02* | (2006.01) | |
| *G11C 5/06* | (2006.01) | |
| *G11C 29/12* | (2006.01) | |

(52) U.S. Cl.
CPC ............ *G01R 31/3187* (2013.01); *G11C 5/025* (2013.01); *G11C 5/063* (2013.01); *G11C 29/1201* (2013.01)

(58) Field of Classification Search
CPC ........... H01L 2225/06517; H01L 2225/06513; H01L 2225/06544; H01L 2225/06596; H01L 23/5226; H01L 23/481; G01R 31/3187; G11C 29/1201; G11C 5/063; G11C 5/025
See application file for complete search history.

(56) References Cited

U.S. PATENT DOCUMENTS

| | | | |
|---|---|---|---|
| 8,310,066 B2 | 11/2012 | Sasaki | |
| 8,350,389 B2 | 1/2013 | Itaya et al. | |
| 2007/0257353 A1* | 11/2007 | Park | G01R 31/2884 257/690 |
| 2009/0057925 A1 | 3/2009 | Sasaki | |
| 2011/0084385 A1 | 4/2011 | Itaya et al. | |
| 2012/0292759 A1* | 11/2012 | Ishikawa | H01L 22/34 257/737 |
| 2013/0161827 A1* | 6/2013 | Nakazawa | H01L 23/5226 257/774 |

FOREIGN PATENT DOCUMENTS

| | | |
|---|---|---|
| JP | 2009-054862 A | 3/2009 |
| JP | 2011-082450 A | 4/2011 |

* cited by examiner

*Primary Examiner* — Shaun Campbell
(74) *Attorney, Agent, or Firm* — Kunzler Law Group, PC

(57) ABSTRACT

Disclosed herein is a device that includes a semiconductor substrate, a check circuit and a through-substrate via. The check circuit includes a check line formed over the semiconductor substrate and including first and second parts each extending in a first direction and a third part extending in a second direction that crosses the first direction, the first and second parts being opposite to each other, the third part connecting one end of the first part with one end of the second part, a charge circuit coupled to a one end of the check line, and a comparator coupled to the other end of the check line at a first input node thereof. The through-substrate via penetrates through the semiconductor substrate and is located in an area that is between the first and second parts of the check line.

20 Claims, 12 Drawing Sheets

SEMICONDUCTOR DEVICE HAVING PENETRATING ELECTRODES EACH PENETRATING THROUGH SUBSTRATE

BACKGROUND OF THE INVENTION

1. Field of the Invention

The present invention relates to a semiconductor device, and particularly to a semiconductor device equipped with a penetrating electrode which is so provided as to pass through a semiconductor chip.

2. Description of Related Art

Storage capacity required for semiconductor memory devices such as DRAM (Dynamic Random Access Memory) has been growing year by year. To satisfy the requirement, in recent years, a memory device called multi-chip package has been proposed. In the multi-chip package, a plurality of memory chips are stacked. However, in the case of the multi-chip package, wires that connect each memory chip and a package substrate are necessary. Therefore, it is difficult to stack many memory chips.

On the other hand, in recent years, a semiconductor device of a type in which a plurality of memory chips with penetrating electrodes are stacked has been proposed (See Japanese Patent Application Laid-Open No. 2005-136187). In the semiconductor device of the type, among penetrating electrodes provided on each memory chip, the penetrating electrodes that are provided on the same plane position when seen from a stacking direction are electrically short-circuited. Therefore, even if the number of chips stacked increases, the number of electrodes connected to the package substrate does not increase. Thus, it is possible to stack a larger number of memory chips.

When semiconductor chips with penetrating electrodes are stacked, bump electrodes that are provided on upper and lower chips need to be in accurate contact with each other. Accordingly, compared with an operation of stacking chips in the multi-chip package, more accurate positioning is required. As for a device used to stack semiconductor chips having penetrating electrodes, the device disclosed in Japanese Patent Application Laid-Open No. 2006-49417 is known.

However, when the semiconductor chips are stacked, even as accurate positioning is carried out, the bonding strength between the semiconductor chips could be uneven if the semiconductor chips are warped. In such a case, there is the possibility that the bump electrodes, which should be originally bonded together, come off from each other, possibly lowering the reliability of products.

SUMMARY

In one embodiment, there is provided a semiconductor device that includes: a semiconductor substrate including an electrode forming area; a plurality of through-substrate vias each penetrating through the semiconductor substrate and disposed in the electrode forming area; a check line arranged to pass through the electrode forming area; a charge circuit connected to one end of the check line to supply a first potential to the check line; a reset circuit connected to the other end of the check line to supply a second potential different from the first potential to the check line; and a determination circuit that determines a voltage of the other end of the check line.

In another embodiment, there is provided a semiconductor device that includes: a semiconductor substrate including an electrode forming area; a plurality of through-substrate vias each penetrating through the semiconductor substrate and disposed in the electrode forming area; a multi-level wiring structure formed on the semiconductor substrate in the electrode forming area, the multi-level wiring structure including a plurality of wiring layers; a check line used to detect whether the multi-level wiring structure is cracked; and a determination circuit outputting a determination signal that takes a first logic level when the check line indicates that the multi-level wiring structure is cracked, and outputting the determination signal that takes a second logic level different from the first logic level when the check line indicates that the multi-level wiring substructure is not cracked.

In still another embodiment, there is provided a device that includes: a semiconductor substrate, a first check circuit and a first through-substrate via. The first check circuit includes a first check line formed over the semiconductor substrate and including first and second parts each extending in a first direction and a third part extending in a second direction that crosses the first direction, the first and second parts being opposite to each other, the third part connecting one end of the first part with one end of the second part; a first charge circuit coupled to a one end of the check line; and a first comparator coupled to the other end of the first check line at a first input node thereof. The first through-substrate via penetrates through the semiconductor substrate and is disposed in a first area that is between the first and second parts of the first check line.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
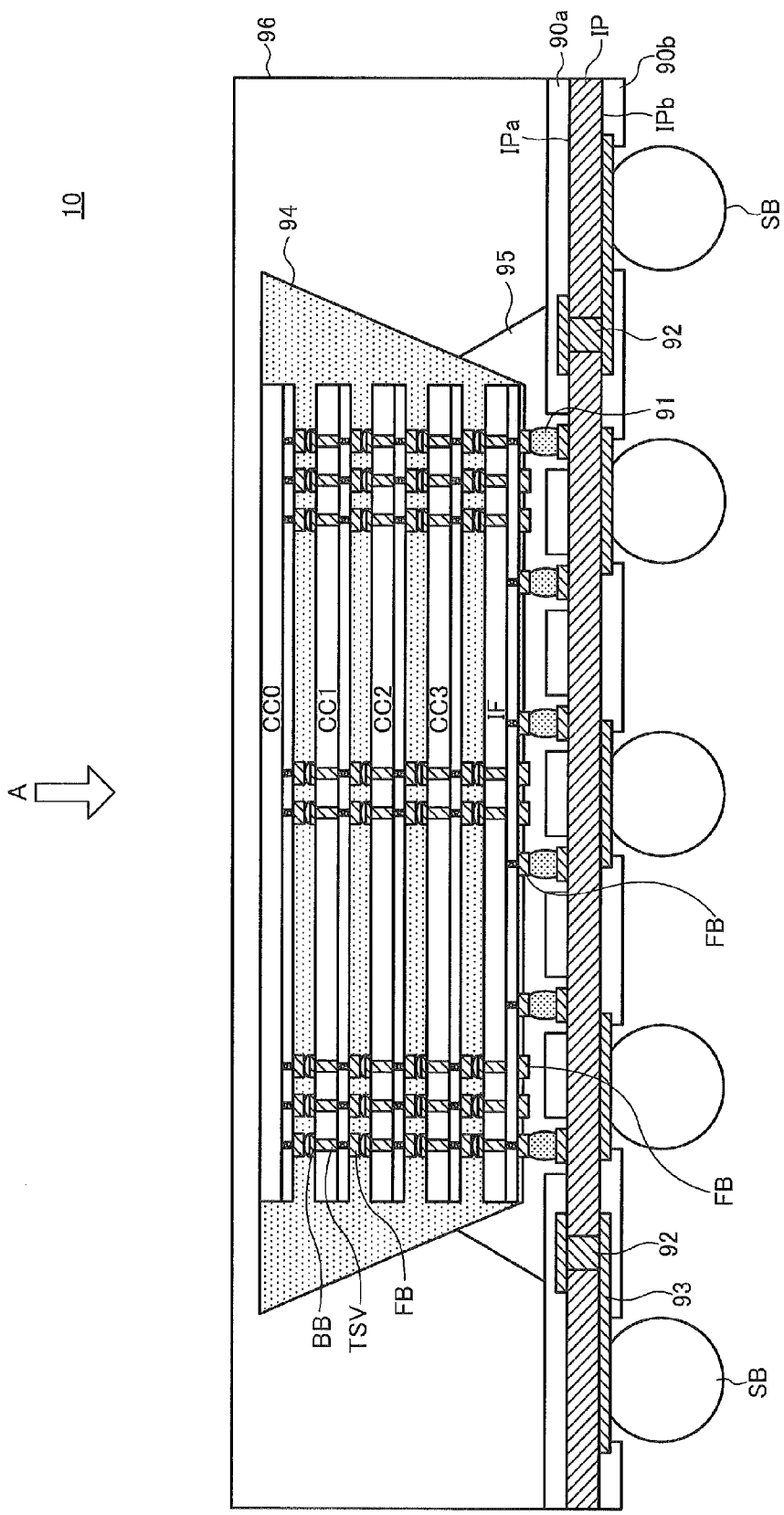
FIG. 1 is a schematic cross-sectional view of a semiconductor device an embodiment of the present invention.

Referring now to FIG. 1, the semiconductor device 10 of the embodiment has a structure in which the following components are stacked: four core chips CC0 to CC3, which have the same functions and are produced with the use of the same production mask; one interface chip IF, which is produced with the use of a different production mask from that of the core chips CC0 to CC3; and one interposer IP. The core chips CC0 to CC3 and the interface chip IF are semiconductor chips for which a silicon substrate is used, and are stacked by a face-down manner on the interposer IP. The face-down manner means a method of mounting semiconductor chips in such a way that principal surfaces on which electronic circuits such as transistors are formed face downward, or that the principal surfaces face the interposer IP's side.

However, the semiconductor device of the present invention is not limited to the above structure. The semiconductor chips each may be stacked by a face-up method. The face-up method means a method of mounting semiconductor chips in such a way that principal surfaces on which electronic circuits such as transistors are formed face upward, or that the principal surfaces face a side opposite to the interposer IP's side. Alternatively, the semiconductor chips stacked by the face-down manner, and the semiconductor chips stacked by the face-up manner may exist together.

The core chips CC1 to CC3 and the interface chip IF other than the core chip CC0 placed on the top layer are provided with large numbers of penetrating electrodes TSV that pass through a silicon substrate. The penetrating electrodes may be called penetration electrodes, through-vias, or through-substrate vias. In areas that overlap with the penetrating electrodes TSV when seen from a stacking direction in planar view, top-surface bumps FB are provided on the principal-surface sides of the chips, and back-surface bumps BB are provided on the back-surface sides of the chips. The back-surface bumps BB of a semiconductor chip placed on a lower layer are bonded to the top-surface bumps FB of a semiconductor chip placed on an upper layer. In this manner, the semiconductor chips that are adjacent to each other in the vertical direction are electrically connected.

According to the present embodiment, the reason why no penetrating electrode TSV is provided on the top-layer core chip CC0 is because there is no need to form a bump electrode on the back-surface side of the core chip CC0 as the chips are stacked by the face-down manner. If no penetrating electrode TSV is provided on the top-layer core chip CC0 as described above, the top-layer core chip CC0 can be made thicker than the other core chips CC1 to CC3 to increase the mechanical strength of the core chip CC0. Alternatively, a penetrating electrode TSV may be provided on the top-layer core chip CC0. In this case, all the core chips CC0 to CC3 can be produced by the same process.

The core chips CC0 to CC3 are semiconductor chips made by removing the so-called front-end section, which serves as an interface with the outside, from circuit blocks contained in a typical SDRAM (Synchronous Dynamic Random Access Memory) that operates alone. In other words, the core chips CC0 to CC3 are memory chips on which only circuit blocks belonging to the back-end section are integrated. Among the circuit blocks contained in the front-end section, there are a parallel-to-serial conversion circuit, which performs parallel-to-serial conversion of input/output data between a memory cell array and a data input/output terminal, a DLL (Delay Locked Loop) circuit, which controls an input/output timing of data, and the like.

Meanwhile, the interface chip IF is a semiconductor chip on which only circuit blocks of the front-end section are integrated, among circuit blocks contained in a typical SDRAM that operates alone. The interface chip IF functions as a common front-end section for the four core chips CC0 to CC3. All accesses from the outside are conducted through the interface chip IF, and inputting and outputting of data are performed through the interface chip IF.

The interposer IP is a circuit board made of resin. On a back surface IPb thereof, a plurality of external terminals (solder balls) SB are formed. The interposer IP ensures the mechanical strength of the semiconductor device 10 and functions as a redistribution substrate to expand an electrode pitch. That is, substrate electrodes 91 that are formed on a top surface IPa of the interposer IP are led out to the back surface IPb via through-hole electrodes 92; rewiring layers 93 that are provided on the back surface IPb are designed to expand the pitch of the external terminals SB. The areas of the top surface IPa of the interposer IP where no substrate electrode 91 is formed are covered with resist 90a. The areas of the back surface IPb of the interposer IP where no external terminal SB is formed are covered with resist 90b. FIG. 1 shows only five external terminals SB. However, a large number of external terminals is actually provided. The layout of the external terminals SB is the same as that of a SDRAM determined by the standard. Accordingly, an external controller can handle the external terminals SB as those of one SDRAM.

The gaps between the core chips CC0 to CC3 and interface chip IF stacked are filled with underfill 94. In this manner, the mechanical strength is ensured. The gap between the interposer IP and the interface chip IF is filled with NCP (Non-Conductive Paste) 95. The entire package is covered with mold resin 96. In this manner, each chip is physically protected.

Figures 2A, 2B, 2C:
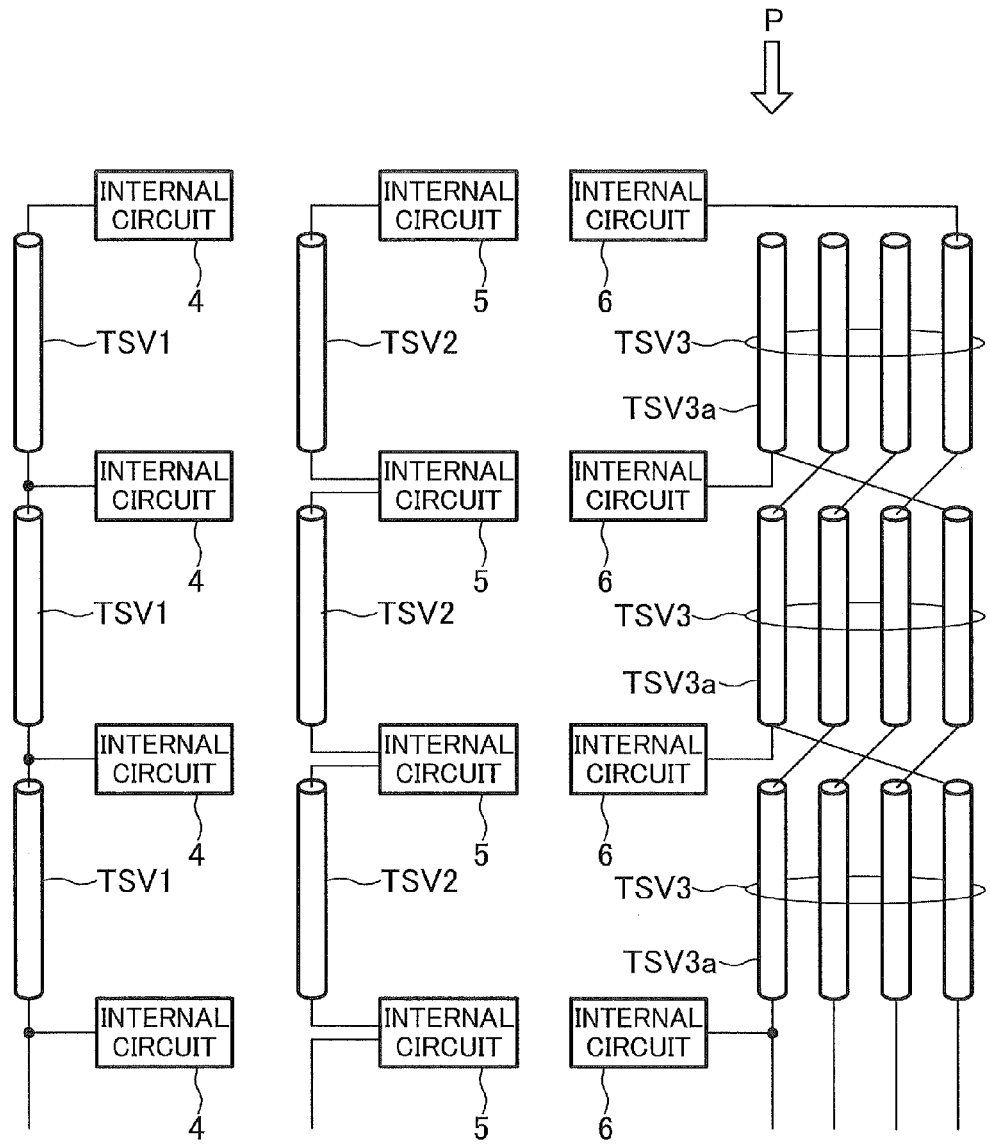
FIGS. 2A to 2C are diagram for explaining the various types of penetrating electrodes TSV provided in a core chip.

When the penetrating electrodes TSV provided in the core chips CC0 to CC3 are two-dimensionally viewed from a lamination direction, that is, viewed from an arrow A shown in FIG. 1, most of the penetrating electrodes TSV are short-circuited from the penetrating electrodes TSV of other layers provided at the same position. That is, as shown in FIG. 2A, the vertically disposed penetrating electrodes TSV1 that are provided at the same position in plain view are short-circuited, and one wiring line is configured by the through silicon via TSV1. The penetrating electrodes TSV1 that are provided in the core chips CC0 to CC3 are connected to internal circuits 4 in the core chips, respectively. Accordingly, input signals (command signal, address signal, etc.) that are supplied from the interface chip IF to the penetrating electrodes TSV1 shown in FIG. 2A are commonly input to the internal circuits 4 of the core chips CC0 to CC3. Output signals (data etc.) that are supplied from the core chips CC0 to CC3 to the penetrating electrodes TSV1 are wired-ORed and input to the interface chip IF.

Meanwhile, as shown in FIG. 2B, the a part of the penetrating electrodes TSV are not directly connected to the penetrating electrode TSV2 of other layers provided at the same position in plain view but are connected to the penetrating electrode TSV2 of other layers through the internal circuits 5 provided in the core chips CC0 to CC3. That is, the internal circuits 5 that are provided in the core chips CC0 to CC3 are cascade-connected through the penetrating electrode TSV2. This kind of penetrating electrode TSV2 is used to sequentially transmit predetermined information to the internal circuits 5 provided in the core chips CC0 to CC3. As this information, a select signal SELCC to be described below is exemplified.

Another part of the penetrating electrodes TSV is short-circuited from the penetrating electrode TSV of other layer provided at the different position in plain view, as shown in FIG. 2C. With respect to this kind of penetrating electrodes group TSV3, internal circuits 6 of the core chips CC0 to CC3 are connected to the penetrating electrodes TSV3a provided at the predetermined position P in plain view. Thereby, information can be selectively input to the internal circuits 6 provided in the core chips. As this information, defective chip information is exemplified.

As such, three types of penetrating electrodes TSV1 to TSV3 shown in FIGS. 2A to 2C are provided in the core chips CC0 to CC3. As described above, most of the penetrating electrodes TSV are of a type shown in FIG. 2A, and an address signal and a command signal, and the like are supplied from the interface chip IF to the core chips CC0 to CC3, through the penetrating electrode TSV1 of the type shown in FIG. 2A. Read data and write data are input to and output from the interface chip IF through the penetrating electrode TSV1 of the type shown in FIG. 2A. Meanwhile, the penetrating electrodes TSV2 and TSV3 of the types shown in FIGS. 2B and 2C are used to provide individual information to the core chips CC0 to CC3 whereas the core chips CC0 to CC3 have the same structure as one another.

Figure 3:
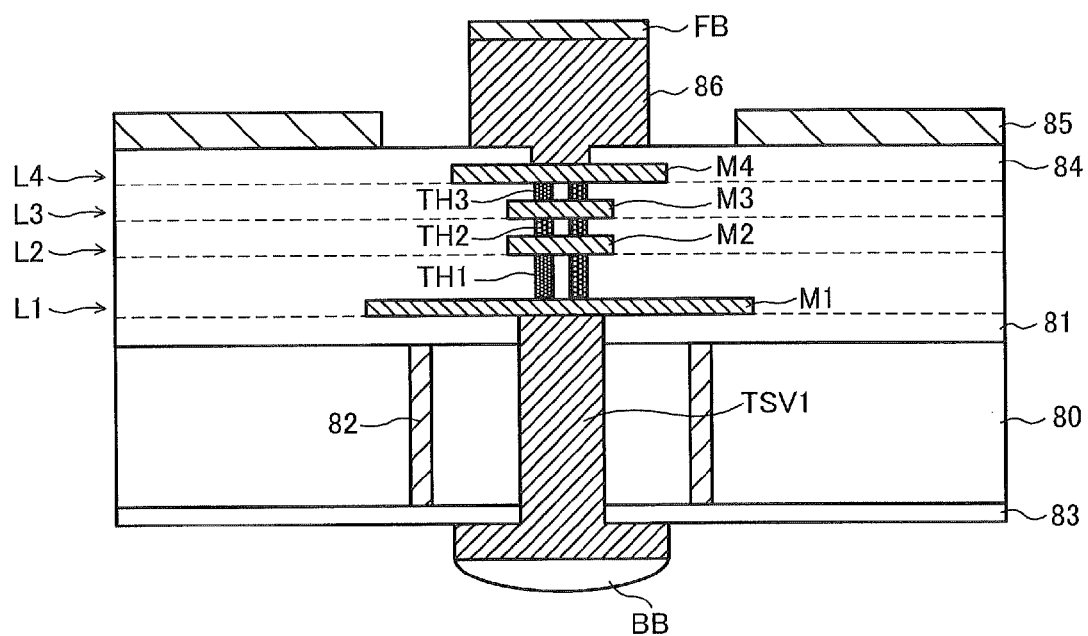
FIG. 3 is a cross-sectional view of a penetrating electrode TSV1.

Turning to FIG. 3, the penetrating electrode TSV1 is so provided as to pass through a silicon substrate 80, an interlayer insulation film 81, which is provided on a top surface of the silicon substrate 80, and a passivation film 83, which is provided on a back surface of the silicon substrate 80. Although not specifically limited, the penetrating electrode TSV1 is made of Cu (copper). The top surface of the silicon substrate 80 serves as a device formation surface on which devices such as transistors and a multi-level wiring structure including wiring layers L1 to L4 are formed. Around the penetrating electrode TSV1, insulation rings 82 are provided to insulate the penetrating electrode TSV1 from a transistor region. Instead of providing the insulation ring 82, an insulation film such as silicon oxide film can be provided on the inner wall of a through-substrate via that is to be filled by the penetrating electrode TSV.

An end portion of the penetrating electrode TSV1 that is closer to the back surface of the silicon substrate 80 is covered with a back-surface bump BB. In the core chips CC1 to CC3, the back-surface bumps BB are in contact with the top-surface bumps FB provided on upper-layer core chips CC0 to CC2, respectively. In the interface chip IF, the back-surface bumps BB are in contact with the top-surface bumps FB provided on the core chip CC3. Although not specifically limited, the back-surface bumps BB are made of SnAg solder, which covers the surfaces of the penetrating electrodes TSV1 made of Cu (copper). The top-surface bump FB is connected to an end portion of the penetrating electrode TSV1 via interconnection pads M1 to M4, which are provided respectively as the wiring layers L1 to L4, and a plurality of through-hole conductors TH1 to TH3, which connect the interconnection pads. In the core chips CC1 to CC3, the top-surface bumps FB are in contact with the back-surface bumps BB provided on the lower-layer core chips CC2 and CC3 and the interface chips IF, respectively. In the interface chip IF, the top-surface bumps FB are in contact with the substrate electrodes 91 on the interposer IP. Although not specifically limited, the top-surface bumps FB include a pillar portion 86 that is made of Cu (copper). A surface of the pillar portion 86 includes a structure in which layers of Ni (nickel) and Au (gold) are stacked. The diameter of the top-surface bumps FE and back-surface bumps BB is about 20 μm.

According to the above configuration, the top-surface bumps FB and back-surface bumps BB that are provided at the same locations in planar view are being short-circuited via the penetrating electrodes TSV1. The pillar portion 86 of a top-surface bump FB is so provided as to pass through a passivation film 84. A top surface of the passivation film 84 except a region where the top-surface bump FB is formed is covered with a polyimide film 85. Incidentally, the connection to internal circuits not shown in the diagram is realized via interconnection lines (not shown), which are led out from the interconnection pads M1 to M3 provided as the wiring layers L1 to L3. In the present specification, the wiring layers L1 to L4 and insulating films intervening therebetween may be referred to as a multi-level wiring structure.

Incidentally, in the interface chip IF, the penetrating electrodes TSV1 of such a kind are partially provided. The penetrating electrodes TSV1 provided on the interface chip IF are used mainly for supplying power supply potential VDD or VSS.

Most of the penetrating electrodes TSV formed in the interface chip IF are connected to backside bumps BB formed in the same positions when seen in a plan view, but not to surface bumps FB formed in the same positions when seen in a plan view. Although not shown in the drawings, such type of penetrating electrodes TSV are configured so that some of the through hole electrodes TH1 to TH3 are missing.

Figure 4:
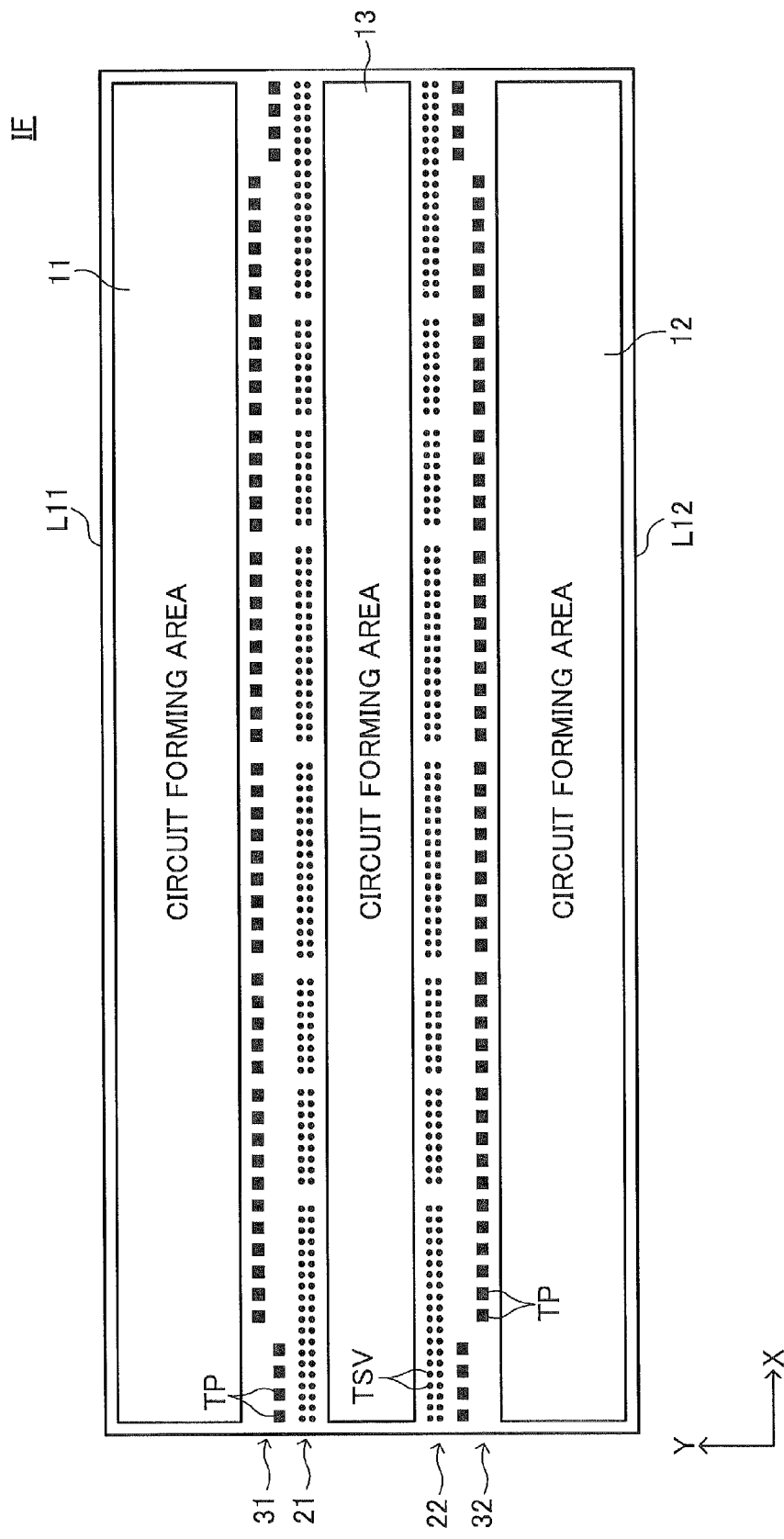
FIG. 4 is a schematic plan view showing the layout of the interface chip IF.

Turning to FIG. 4, the interface chip IF includes circuit forming areas 11 to 13 which extend in the X direction. The circuit forming area 11 is arranged along one side L11 in the Y direction. The circuit forming area 12 is arranged along the other side L12 in the Y direction. The circuit forming area 13 is arranged in the center in the Y direction. Various circuit blocks are formed in the circuit forming areas 11 to 13, including a command decoder, a DLL circuit, a control logic circuit, and an internal voltage generation circuit.

Penetrating electrode forming areas 21 and 22 are formed between the circuit forming areas 11 and 13 and between the circuit forming areas 12 and 13, respectively. The penetrating electrode forming areas 21 and 22 are areas where a plurality of penetrating electrodes TSV formed to run through the interface chip IF are regularly arranged. In the present embodiment, the penetrating electrodes formed in each of the penetrating electrode forming areas 21 and 22 are grouped into eight groups. Note that all the penetrating electrodes formed in the penetrating electrode forming areas 21 and 22 need not necessarily be regularly arranged.

A test pad forming area 31 is formed between the circuit forming area 11 and the penetrating electrode forming area 21. A test pad forming area 32 is formed between the circuit forming area 12 and the penetrating electrode forming area 22. The test pad forming areas 31 and 32 are areas where a plurality of test pads TP are formed. The test pads TP are terminals for tester probes to be put into contact with when performing a test in a wafer state.

Figure 5:
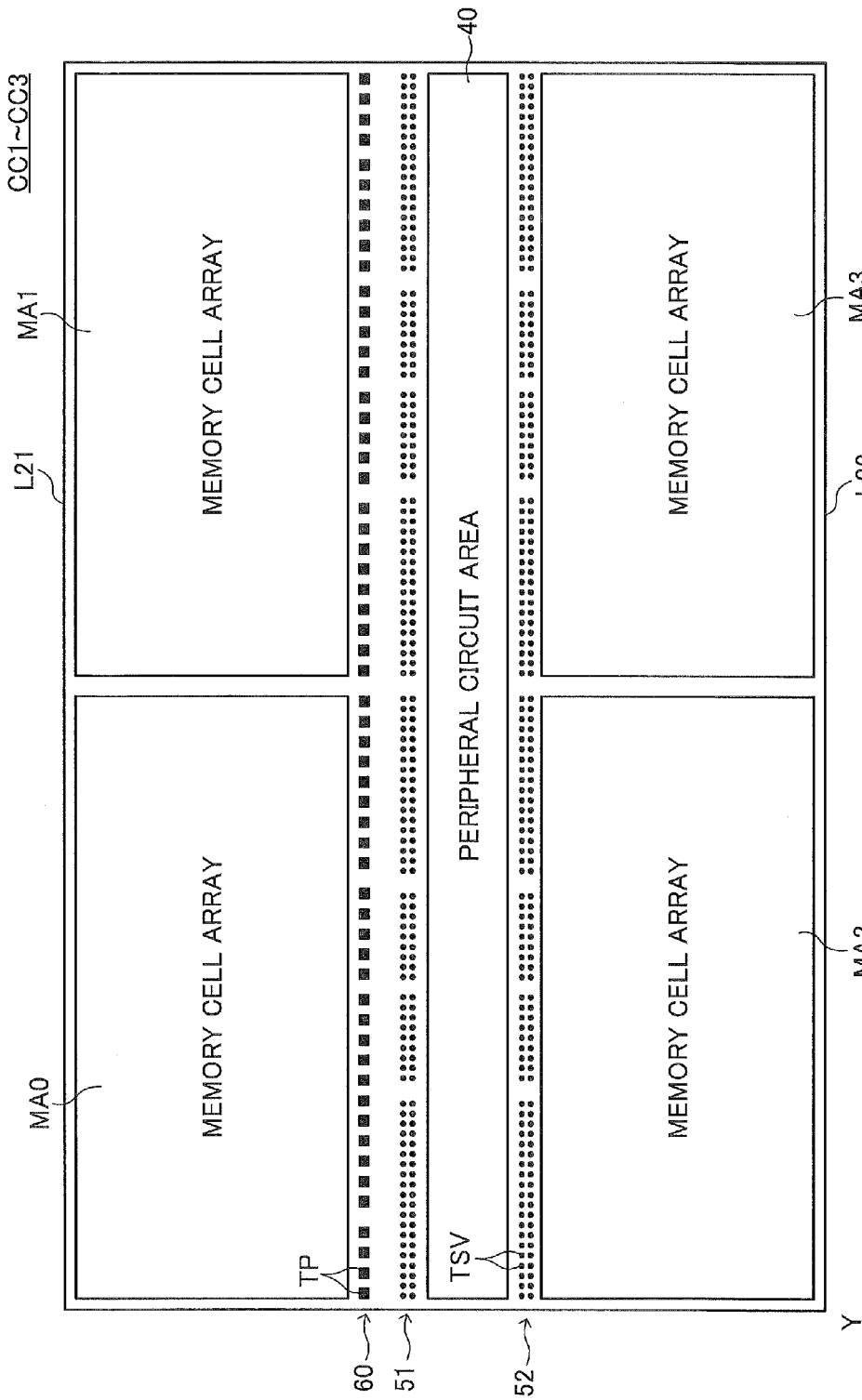
FIG. 5 is a schematic plan view showing the layout of the core chips CC1 to CC3.

Turning to FIG. 5, each of the core chips CC1 to CC3 includes four memory cell arrays MA0 to MA3. Of these, the memory cell arrays MA0 and MA1 are arranged along one side L21 in the Y direction. The memory cell arrays MA2 and MA3 are arranged along the other side L22 in the Y direction. The memory cell arrays MA0 to MA3 are areas where a large number of memory cells are formed in a matrix.

A peripheral circuit area 40 is arranged between the memory cell arrays MA0 and MA1 and the memory cell arrays MA2 and MA3. Various circuit blocks are formed in the peripheral circuit area 40, including an address decoder, a timing control circuit, and an internal voltage generation circuit.

A penetrating electrode forming area 51 is formed between the memory cell arrays MA0 and MA1 and the peripheral circuit area 40. A penetrating electrode forming area 52 is formed between the memory cell arrays MA2 and MA3 and the peripheral circuit area 40. The penetrating electrode forming areas 51 and 52 are areas where a plurality of penetrating electrodes TSV are formed to penetrate through the corresponding core chip CC1, CC2, or CC3. The penetrating electrodes TSV are located in planar positions coincident with those of the penetrating electrodes TSV formed in the interface chip IF. Consequently, when the core chips CC0 to CC3 and the interface chip IF are stacked, the backside bumps BB of lower chips are joined to the surface bumps FB of upper chips.

A test pad forming area 60 is further formed between the memory cell arrays MA0 and MA1 and the penetrating electrode forming area 51. The test pad forming area 60 is an area where a plurality of test pads TP are formed.

In the penetrating electrode forming areas 21, 22, 51, and 52 shown in FIGS. 4 and 5, a plurality of penetrating electrodes TSV are formed to penetrate through the semiconductor substrate 80. The multi-level wiring structure shown in FIG. 3 is also formed on the semiconductor substrate 80 in the penetrating electrode forming areas 21, 22, 51, and 52. As described above, the multi-level wiring structure is a stack of a plurality of wiring layers and insulation films formed on the top and bottom of the wiring layers. It will be understood that such a multi-level wiring structure is also formed on the semiconductor substrate outside the penetrating electrode forming areas 21, 22, 51, and 52. In the process of stacking the core chips CC0 to CC3 and the interface chip IF, the penetrating electrodes TSV are subjected to high stress. This can produce cracks in the multi-level wiring structure on the penetrating electrode forming areas 21, 22, 51, and 52.

Cracks have various shapes. In the depth direction, some cracks may extend from the uppermost passivation film 84 to the lowermost interlayer insulation film 81. In the planar direction, some may run across an area corresponding to several to several tens of penetrating electrodes TSV. If such cracks occur, wiring in the cracked portions may be broken to make the chip malfunction. The causes of crack-based malfunctions have conventionally been difficult to identify, whereas the present embodiment can easily identify the causes as will be described later.

Figure 6:
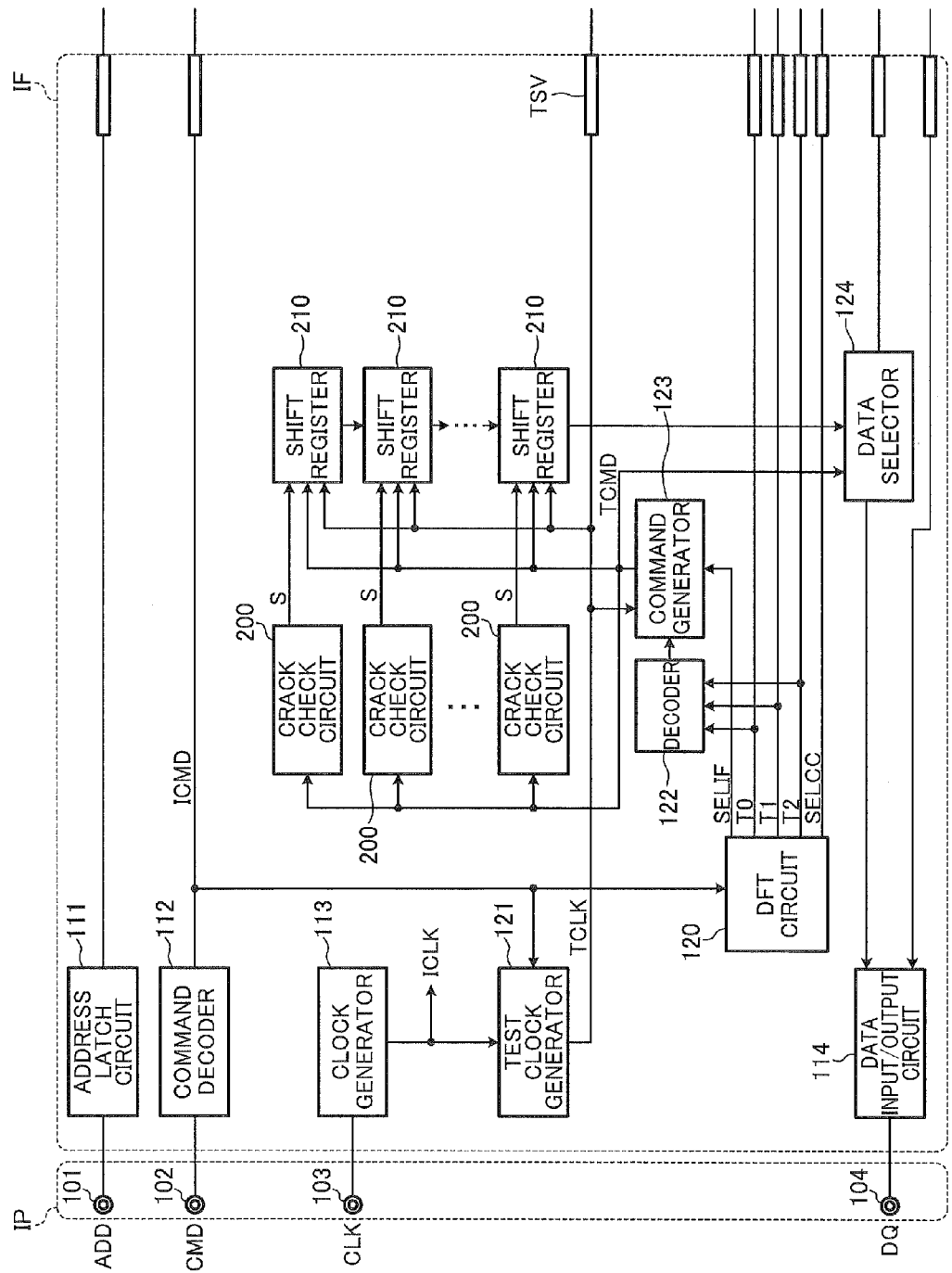
FIG. 6 is a block diagram showing the circuit configuration of essential parts of the interposer IP and the interface chip IF.

Turning to FIG. 6, the interposer IP has external terminals including an address terminal 101, a command terminal 102, a clock terminal 103, and a data terminal 104. All such external terminals are connected to the interface chip IF, but not directly to the core chips CC0 to CC3. The interposer IP also includes a data strobe terminal, a calibration terminal, a power supply terminal, and the like, which are omitted from the diagram.

The address terminal 101 is supplied with an address signal ADD. The address signal ADD is latched into an address latch circuit 111 in the interface chip IF. The address signal ADD latched into the address latch circuit 111 is supplied to the core chips CC0 to CC3 via penetrating electrodes TSV.

The command terminal 102 is supplied with a command signal CMD. The command signal CMD is decoded by a command decoder 112 in the interface chip IF, whereby an internal command ICMD is generated. The internal command ICMD is supplied to the core chips CC0 to CC3 via penetrating electrodes TSV and to a DFT circuit 120 and a test clock generator 121 in the interface chip IF. The DFT circuit 120 and the test clock generator 121 are circuit blocks to be activated when the internal command ICMD indicates a test command.

The clock terminal 103 is supplied with a clock signal CLK. The clock signal CLK is supplied to a clock generator 113. The clock generator 113 generates an internal clock signal ICLK based on the clock signal CLK, and supplies the internal clock signal ICLK to various circuit blocks including the test clock generator 121.

The data terminal 104 is a terminal for inputting and outputting data DQ. The data terminal 104 is connected to a data input/output circuit 114. Write data supplied to the data input/output circuit 114 through the data terminal 104 is transferred to the core chips CC0 to CC3 via penetrating electrodes TSV. Read data read from the core chips CC0 to CC3 is output to the data terminal 104 through the data input/output circuit 114.

The interface chip IF further includes a plurality of crack check circuits 200. The crack check circuits 200 are circuits for checking the multi-level wiring structure on the penetrating electrode forming areas 21 and 22 shown in FIG. 4 for cracks. The reason why a plurality of crack check circuits 200 are provided is to divide the penetrating electrodes TSV arranged in the penetrating electrode forming areas 21 and 22 into a plurality of groups and detect the presence or absence of a crack in each group. In the present invention, more than one crack check circuit 200 need not necessarily be provided. The provision of the crack check circuits 200 for the respective groups allows an evaluation of which part of the penetrating electrode forming areas 21 and 22 is cracked.

As has been described with reference to FIG. 4, in the present embodiment, the penetrating electrodes TSV formed in each of the penetrating electrode forming areas 21 and 22 are grouped into eight groups. In other words, the penetrating electrodes TSV are grouped into a total of 16 groups. The crack check circuits 200 are allocated for the respective 16 groups. The crack check circuits 200 operate based on a test command TCMD output from a command generator 123. A specific circuit configuration of the crack check circuits 200 will be described later.

The command generator 123 shown in FIG. 6 is activated by a select signal SELIF output from the DFT circuit 120, and activates a plurality of test commands TCMD in succession based on an output signal from a decoder 122. The decoder 122 is a circuit that decodes three bits of command signals T0 to T2 supplied from the DFT circuit 120. The command signals T0 to T2 are also supplied to the core chips CC1 to CC3 via penetrating electrodes TSV.

Detection signals S output from the crack check circuits 200 are supplied respectively to shift registers 210. The shift registers 210 latch the detection signals S from the corresponding crack check circuits 200 in response to the test commands TCMD, and serially output the detection signals S in synchronization with a test clock signal TCLK. The output detection signals S are output to outside through a data selector 124 and the data input/output circuit 114. The test clock signal TCLK is a signal generated by the test clock generator 121. The test clock signal TCLK is supplied to the command generator 123, and to the core chips CC1 to CC3 via penetrating electrodes TSV. The data selector 124 is a circuit that selects either the detection signals S generated inside the interface chip IF or detection signals S transferred from the core chips CC1 to CC3 based on the test commands TCMD.

Figure 7:
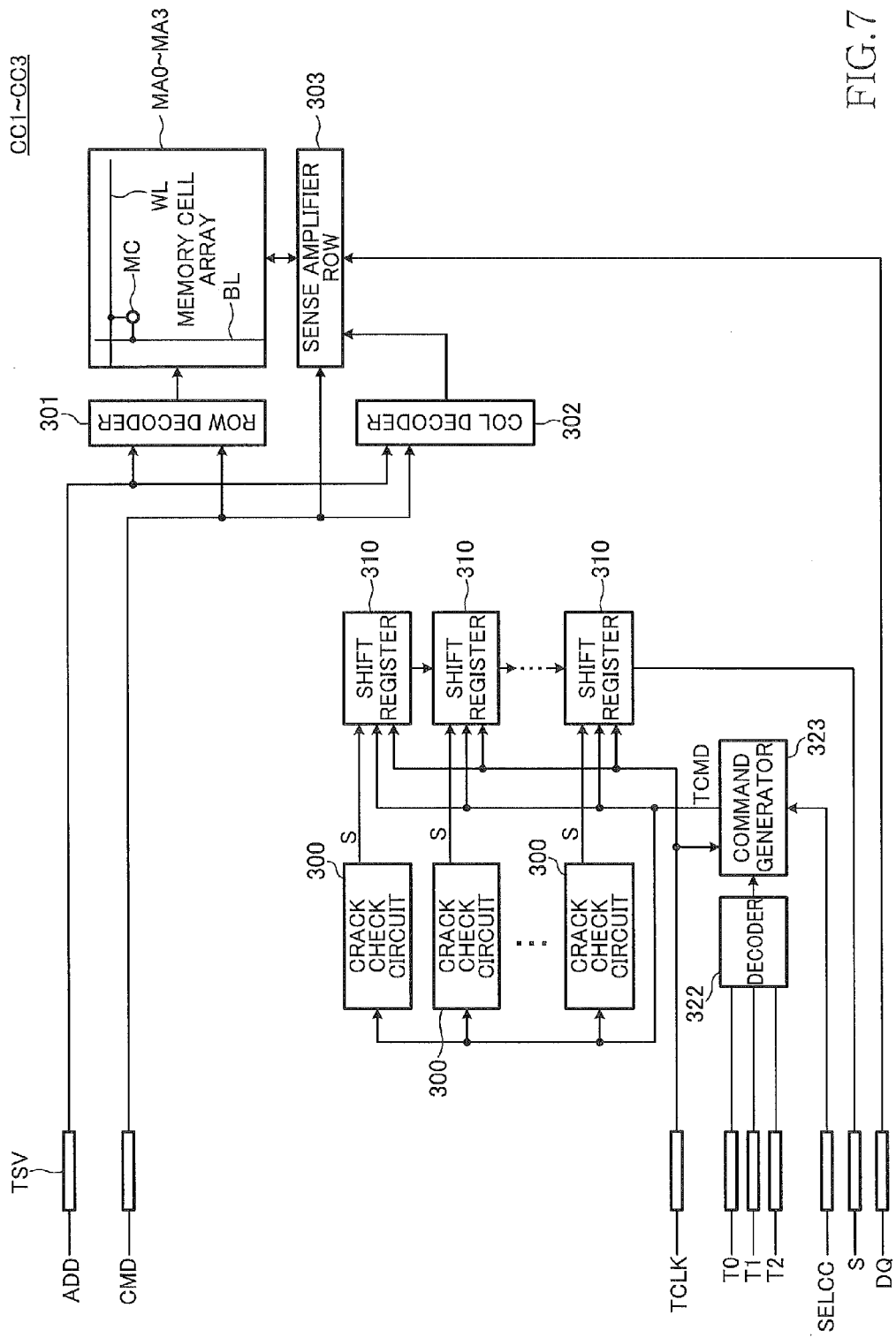
FIG. 7 is a block diagram showing the circuit configuration of essential parts of the core chips CC1 to CC3.

Turning to FIG. 7, the core chips CC1 to CC3 include the memory cell arrays MA0 to MA3. Each of the memory cell arrays MA0 to MA3 includes a plurality of word lines WL and a plurality of bit lines BL, at intersections of which are arranged memory cells MC. For the sake of simplicity, FIG. 7 shows only one word line WL, one bit line BL, and one memory cell MC connected thereto.

The word lines WL are selected by a row decoder 301. The row decoder 301 selects the word lines WL based on the address signal ADD (row address) supplied from the interface chip IF via the penetrating electrodes TSV. The bit lines BL are connected to respective corresponding sense amplifiers in a sense amplifier row 303. The sense amplifiers are selected by a column decoder 302 based on the address signal ADD (column address) supplied from the interface chip IF via the penetrating electrodes TSV. With such a configuration, read data read from the memory cell arrays MA0 to MA3 is transferred to the interface chip IF via the penetrating electrodes TSV. Write data supplied from the interface chip IF via the penetrating electrodes TSV is written into the memory cell arrays MA0 to MA3.

Like the interface chip IF, the core chips CC1 to CC3 each include a plurality of crack check circuits 300. The crack check circuits 300 are circuits for checking the multi-level wiring structure on the penetrating electrode forming areas 51 and 52 shown in FIG. 5 for cracks. The reason why a plurality of crack check circuits 300 are provided is that the penetrating electrodes TSV arranged in the penetrating electrode forming areas 51 and 52 are divided into a plurality of groups. The crack check circuits 300 can thus evaluate which part of the penetrating electrode forming areas 51 and 52 is cracked.

The crack check circuits 300 operate based on various test commands TCMD output from a command generator 323. The command generator 323 is activated by a select signal SELCC supplied from the DFT circuit 120 in the interface chip IF, and activates various test commands TCMD in succession based on an output signal from a decoder 322. The decoder 322 is a circuit that decodes the three bits of command signals T0 to T2 supplied from the DFT circuit 120. The select signal SELCC is transferred from the lower core chip CC3 to the upper core chip CC1 in succession via the penetrating electrodes TSV2 shown in FIG. 2B, whereby the command generators 323 in the core chips CC1 to CC3 are activated in succession.

Detection signals S output from the crack check circuits 300 are supplied respectively to shift registers 310. The shift registers 310 latch the detection signals S from the corresponding crack check circuits 300 in response to the test commands TCMD, and serially output the detection signals S in synchronization with the test clock signal TCLK. The output detection signals S are supplied to the interface chip IF via the penetrating electrodes TSV, and output to outside through the data selector 124 and the data input/output circuit 114 in the interface chip IF. The test clock signal TCLK is supplied from the interface chip IF via the penetrating electrodes TSV.

In the examples shown in FIGS. 6 and 7, the detection signals S are transferred by using the dedicated penetrating electrodes TSV. Alternatively, the detection signals S may be transferred by using other penetrating electrodes TSV that are unused during a check operation, such as the penetrating electrodes TSV intended for data DQ. The same applies for the penetrating electrodes TSV that are used to transfer the command signals T0 to T2.

The core chip CC0 lying at the uppermost layer has no penetrating electrode TSV, and thus need not include the crack check circuits 300 or the relevant circuits. Since the core chips CC0 to CC3 are preferably fabricated by using the same manufacturing masks, the core chip CC0 in fact includes the crack check circuits 300 and the relevant circuits. The core chip CC0 is also joined by using surface bumps FB, so that cracks can occur in the areas where the surface bumps FB are formed. To perform a check operation using the crack check circuits 300 formed in the core chip CC0 is thus effective.

A configuration of the crack check circuits 200 formed in the interface chip IF will be explained with reference to FIG. 8. The crack check circuits 300 formed in the core chips CC1 to CC3 have the same circuit configuration as that of the crack check circuits 200 shown in FIG. 8.

Figure 8:
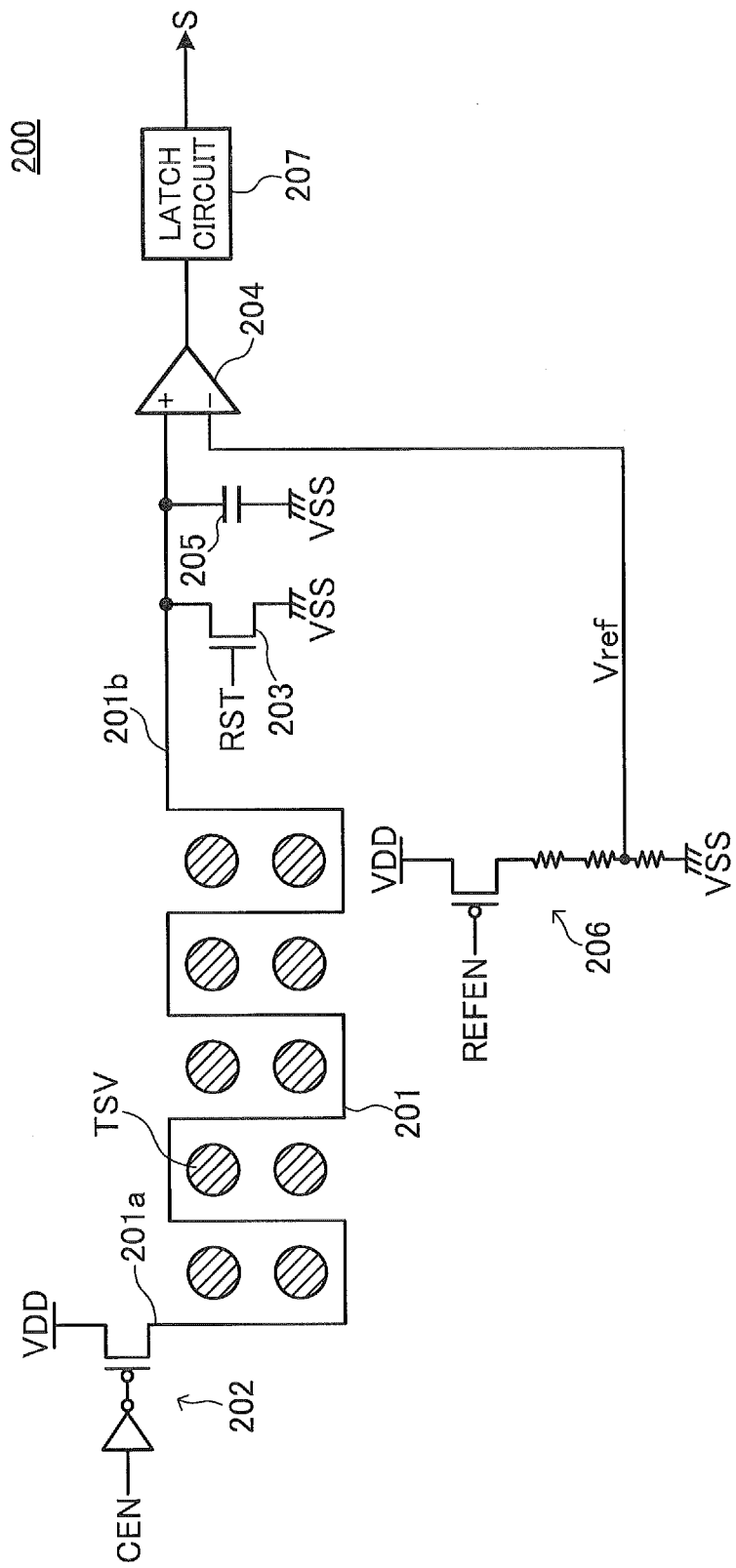
FIG. 8 is a circuit diagram of the crack check circuits 200 formed in the interface chip IF.

As shown in FIG. 8, the crack check circuits 200 each include check line 201, a charge circuit 202 which is connected to one end 201a of the check line 201, and a reset circuit 203 which are connected to the other end 201b of the check line 201, a determination circuit 204, and a retention capacitor 205. The check line 201 is constituted by a wiring layer (s) included in the multi-level wiring structure on the penetrating electrode forming areas 21 and 22. As shown in FIG. 8, the check line 201 winds to avoid hitting penetrating electrodes TSV. The charge circuit 202 includes a P-channel MOS transistor. When a charge signal CEN that is one of the test commands TCMD is activated to a high level, the charge circuit 202 supplies a power supply potential VDD to the one end 201a of the check line 201. The reset circuit 203 includes an N-channel MOS transistor. When a reset signal RST that is one of the test commands TCMD is activated to a high level, the reset circuit 203 supplies a ground potential VSS to the other end 201b of the check line 201. The potential of the other end 201b of the check line 201 is temporarily retained by the retention capacitor 205.

The determination circuit 204 includes a comparator having a positive input node (+) and a negative input node (−). The positive input node (+) is connected to the other end 201b of the check line 201. The negative input node (−) is supplied with a reference voltage Vref. The reference voltage Vref is generated by a reference voltage generation circuit 206 in response to an enable signal REFEN, one of the test commands TCMD. The reference voltage Vref is set to an intermediate level between the power supply potential VDD and the ground potential VSS. The output signal of the determination circuit 204 is taken into a latch circuit 207. An output signal of the latch circuit 207 is a detection signal S. If the other end 201b of the check line 201 has a potential higher than the reference voltage Vref, the detection signal S becomes a high level. If the other end 201b of the check line 201 has a potential lower than the reference voltage Vref, the detection signal S becomes a low level.

Figure 9:
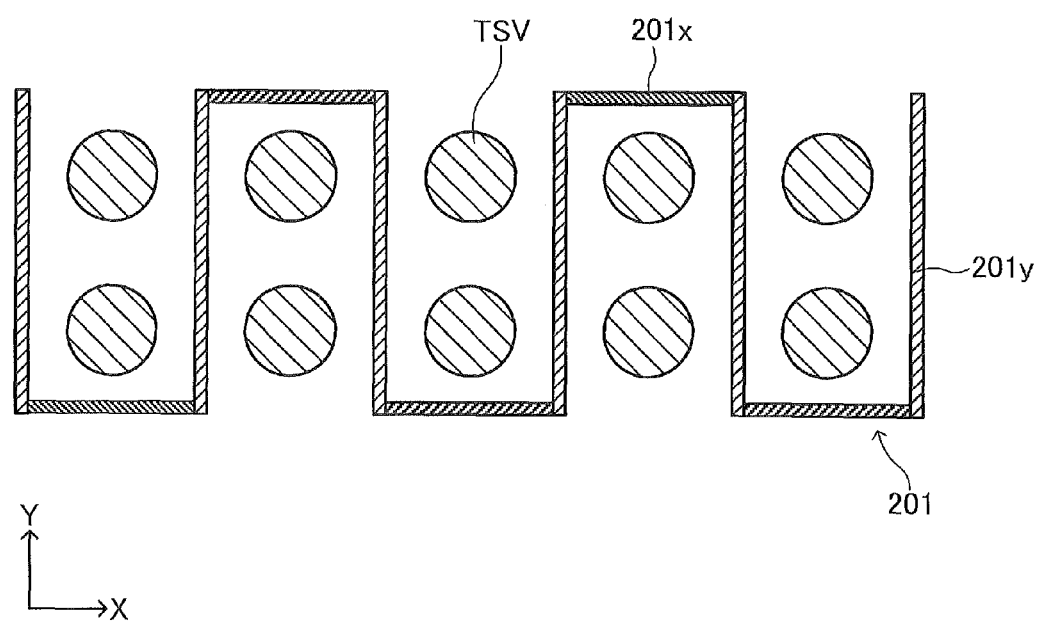
FIG. 9 is a schematic plan view for explaining the layout of the check line 201.

As shown in FIG. 9, the check line 201 includes wiring portions 201x extending in the X direction and wiring portions 201y extending in the Y direction. The wiring portions 201x adjoin the penetrating electrodes TSV in the Y direction when seen in a plan view. The wiring portions 201y adjoin the penetrating electrodes TSV in the X direction when seen in a plan view. By such winding, the check line 201 can be laid out over a wider range on the penetrating electrode forming areas 21 and 22, which facilitates detecting the occurrence of cracks. The wiring portions 201x and the wiring portions 201y are preferably, though not limited to, formed as different wiring layers. For example, the wiring portions 201x may be formed as the wiring layer L3 shown in FIG. 3, and the wiring portions 201y may be formed as the wiring layer L4 shown in FIG. 3. Such configuration facilitates the layout of the check line 201.

Figure 10:
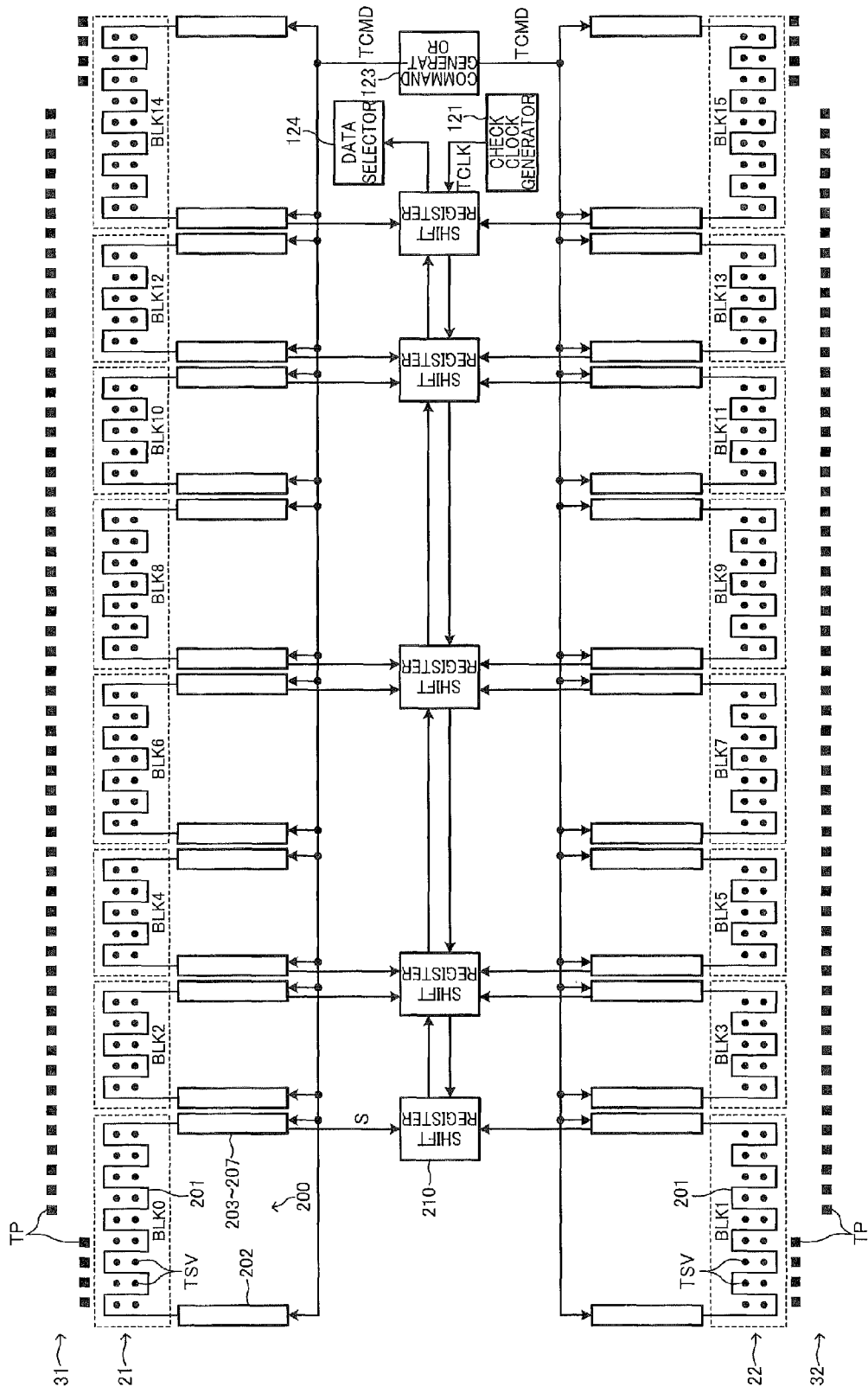
FIG. 10 is a schematic plan view for explaining the layout of the check line 201 in the interface chip IF.

Turning to FIG. 10, in the present embodiment, the penetrating electrodes TSV arranged in the penetrating electrode forming areas 21 and 22 are grouped into 16 groups (BLK0 to BLK15). The check line 201 and the relevant circuits 202 to 207 are provided for each group. In other words, there are 16 crack check circuits 200. The command generator 123 supplies the test commands TCMD to the 16 crack check circuits 200 in common. The 16 crack check circuits 200 therefore simultaneously perform a check detection operation and simultaneously output the detection signals S. The detection signals S retained in the shift registers 210 are serially output to the data selector 124 in synchronization with the test clock signal TCLK.

As described above, the plurality of crack check circuits 200 within the chip operate simultaneously. On the other hand, the crack check circuits 200 and 300 of different chips operate sequentially. The reason is to prevent a conflict between the detection signals S output from the shift registers 210 and 310. Which chip to perform a crack detection operation is selected by the select signals SELIF and SELCC output from the DFT circuit 120. For example, crack detection operations may be performed in order of the interface chip IF and the core chips CC3, CC2, and CC1, and the detection signals S may be output in that order. As described above, the core chip CC0 may also perform a crack detection operation.

Figure 11:
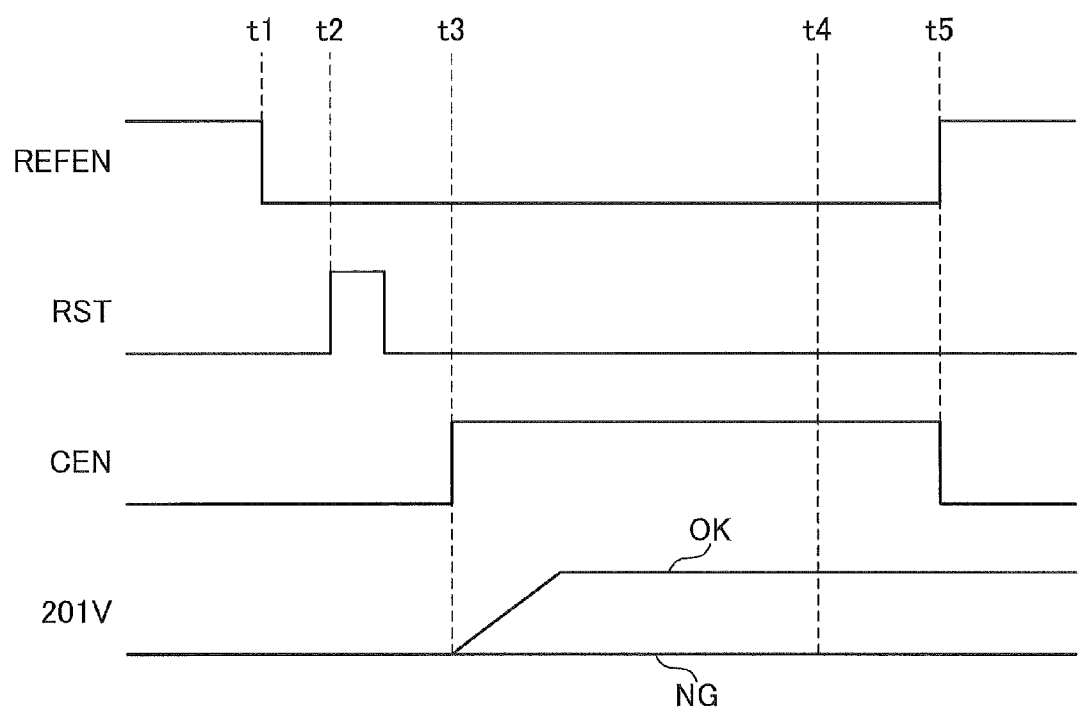
FIG. 11 is a timing chart for explaining the operation of the crack check circuits 200.

An operation of the crack check circuits 200 will be explained with reference to FIG. 11. The same applies for the operation of the crack check circuits 300 included in the core chips CC1 to CC3.

Suppose that a crack check circuit 200 enters a test mode for performing a crack detection operation. Initially, the determination circuit 204 is activated, the latch circuit 207 is reset, and the enable signal REFEN is activated to a low level (time t1). This activates the reference voltage generation circuit 206, and the reference voltage Vref is supplied to the negative input node (−) of the determination circuit 204.

Next, the reset signal RST is temporarily set to a high level, whereby the potential of the check line 201 is reset to the ground potential VSS (time t2). Next, the charge signal CEN is activated to a high level, whereby the one end 201a of the check line 201 is connected to the power supply potential VDD (time t3). If the check line 201 is not broken, a potential 201V at the other end of the check line 201 rises as shown by the waveform OK. If the check line 201 is broken, the potential 201V at the other end of the check line 201 remains at the ground potential VSS as shown by the waveform NG. Such a state is maintained for a predetermined time before the output signal of the determination circuit 204 is latched into the latch circuit 207 at time t4. At time t5, the enable signal REFEN and the charge signal CEN are deactivated to end a series of crack detection operations.

The detection signal S latched into the latch circuit 207 is then transferred to the shift register 210 and output to outside in synchronization with the test clock signal TCLK.

After such an operation, a detection signal S of high level shows that the check line 201 is not broken, i.e., the corresponding penetrating electrode forming area is not cracked. On the other hand, a detection signal S of low level shows that the check line 201 can be broken, i.e., the corresponding penetrating electrode forming area can be cracked. Since the detection signals S are serially output to outside, it is possible to evaluate which area of which chip is cracked.

As described above, according to the present embodiment, if the multi-level wiring structures on the penetrating electrode forming areas 21, 22, 51, and 52 are cracked, which area of which chip is cracked can be evaluated without disassembling the stacked core chips CC0 to CC3 and interface chip IF.

Figure 12:
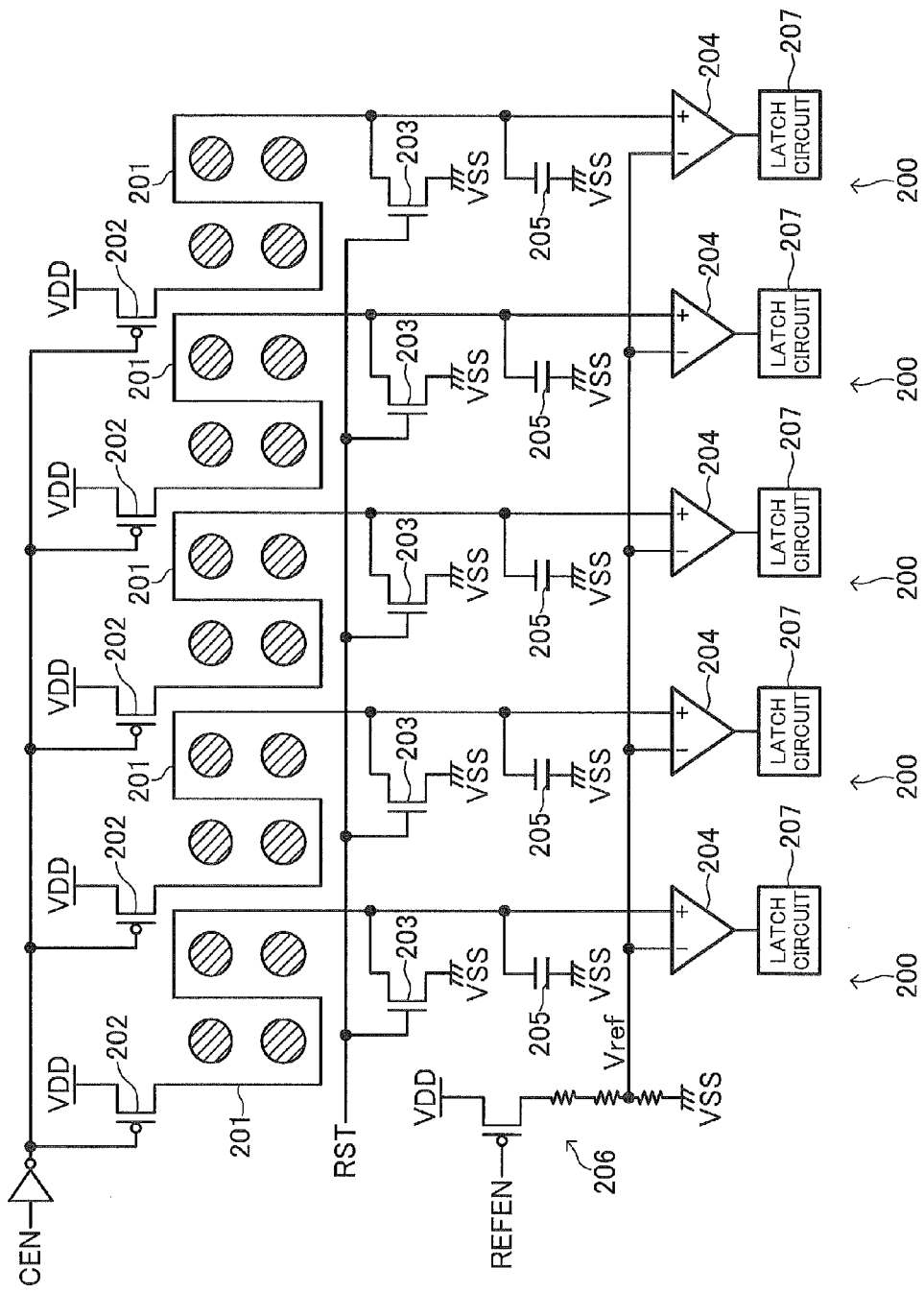
FIG. 12 is a circuit diagram of crack check circuits 200 according to a modification.

FIG. 12 is a circuit diagram of crack check circuits 200 according to a modification. A plurality of crack check circuits 200 shown in FIG. 12 are provided for a single group of penetrating electrodes TSV, not one for a single group of penetrating electrodes TSV. In other words, a group is subdivided into a plurality of subgroups, and a crack check circuit 200 is allocated for each subgroup. Such a configuration can identify a cracked area in more detail, thereby allowing more detailed evaluation.

It is apparent that the present invention is not limited to the above embodiments, but may be modified and changed without departing from the scope and spirit of the invention.

For example, according to each of the above-described embodiments, there has been described a semiconductor device of a type in which the interface chip IF and the core chips CC0 to CC3 are stacked. However, the present invention is not limited to the above type. Accordingly, the type and number of semiconductor chips stacked are not specifically limited. Moreover, the technical concept of the present invention is realized not only in the situation where a plurality of semiconductor chips are stacked, but also in a single semiconductor chip that has not yet been stacked. The reason is that even a semiconductor chip that has not yet been stacked can achieve the above-described advantageous effects in the subsequent stacking process. Therefore, the scope of the present invention is not limited to the stacked semiconductor device.

What is claimed is:

1. A semiconductor device comprising:
   a semiconductor substrate including an electrode forming area;
   a plurality of through-substrate vias each penetrating through the semiconductor substrate and disposed in the electrode forming area;
   a check line arranged to pass through the electrode forming area;
   a charge circuit connected to one end of the check line to supply a first potential to the check line;
   a reset circuit connected to the other end of the check line to supply a second potential different from the first potential to the check line; and
   a determination circuit that determines a potential of the other end of the check line.

2. The semiconductor device as claimed in claim 1, further comprising first and second memory cell arrays, wherein the electrode forming area is arranged between the first and second memory cell arrays.

3. The semiconductor device as claimed in claim 1, wherein the through-substrate vias are regularly arranged in the electrode forming area.

4. The semiconductor device as claimed in claim 1, further comprising a command generator that activates the reset circuit and deactivates the reset circuit before activating the charge circuit.

5. The semiconductor device as claimed in claim 1, wherein a plurality of electrode forming areas are provided on the semiconductor substrate, and at least one check line is assigned in each of the electrode forming areas.

6. The semiconductor device as claimed in claim 1, further comprising a first wiring layer formed over the semiconductor substrate in the electrode forming area, wherein the check line is formed as the first wiring layer so as to wind in the electrode forming area.

7. The semiconductor device as claimed in claim 1, further comprising a multi-level wiring structure formed on the semiconductor substrate in the electrode forming area, the multi-level wiring structure including a first wiring layer and a second wiring layer provided between the semiconductor substrate and the first wiring layer, wherein the check line includes a plurality of first portions extending in a first direction and a plurality of second portions extending in a second direction intersecting the first direction, the first portions of the check line are formed as the first wiring layer, and the second portions of the check line are formed as the second wiring layer.

8. The semiconductor device as claimed in claim 1, wherein the check line is not electrically connected to any of the through-substrate vias in the electrode forming area.

9. The semiconductor device as claimed in claim 1, further comprising a multi-level wiring structure formed on the semiconductor substrate in the electrode forming area, wherein the check line is used to detect whether the multi-level wiring structure is cracked.

10. A semiconductor device comprising:
a semiconductor substrate including an electrode forming area;
a plurality of through-substrate vias each penetrating through the semiconductor substrate and disposed in the electrode forming area;
a multi-level wiring structure formed on the semiconductor substrate in the electrode forming area, the multi-level wiring structure including a plurality of wiring layers;
a check line, passing through the electrode forming area, used to detect whether the multi-level wiring structure is cracked; and
a determination circuit outputting a determination signal that takes a first logic level when the check line indicates that the multi-level wiring structure is cracked, and outputting the determination signal that takes a second logic level different from the first logic level when the check line indicates that the multi-level wiring substructure is not cracked.

11. The semiconductor device as claimed in claim 10, further comprising first and second memory cell arrays, wherein the electrode forming area is arranged between the first and second memory cell arrays.

12. A device comprising:
a semiconductor substrate;
a first check circuit comprising:
a first check line formed over the semiconductor substrate and including first and second parts each extending in a first direction and a third part extending in a second direction that crosses the first direction, the first and second parts being opposite to each other, the third part connecting one end of the first part with one end of the second part;
a first charge circuit coupled to a one end of the first check line; and
a first comparator coupled to the other end of the first check line at a first input node thereof; and
a first and second through-substrate via penetrating through the semiconductor substrate and the first check line passes between the first and second through-substrate via.

13. The device as claimed in claim 12, further comprising a first power supply line supplied with a first power supply voltage, and wherein the first charge circuit comprises a first transistor coupled between the first power supply line and the one end of the first check line.

14. The device as claimed in claim 13, further comprising a second power supply line supplied with a second power supply voltage that is different from the first power supply voltage, and a first reset circuit including a second transistor coupled between the second power supply line and the other end of the first check line.

15. The device as claimed in claim 13, further comprising a reference voltage generator operatively generating a reference voltage that is between the first and second voltage, and wherein the first comparator coupled to the reference voltage generator at second input node to receive the reference voltage.

16. The device as claimed in claim 12, further comprising;
a plurality of second check circuits each comprising,
a second check line formed over the semiconductor substrate and including fourth and fifth parts each extending in the first direction and the sixth part extending in the second direction, the fourth and fifth parts being opposite to each other, the sixth part connecting one end of the fourth part with one end of the fifth part;
a second charge circuit coupled to a one end of the second check line; and
a second comparator coupled to the other end of the second check line at a second input node thereof; and
a plurality of third through-substrate vias each penetrating through the semiconductor substrate, each of the third through-substrate vias being located in a second area that is between the fourth and fifth parts of the second check line of a corresponding one of the second check circuits.

17. The device as claimed in claim 16, further comprising a plurality of register circuits connected in series to each other, each of the register circuits coupled to an associated one of the first and second check circuits.

18. The device as claimed in claim 12, further comprising a multi-level wiring structure formed on the semiconductor substrate and including first and second wiring layers that are different in level from each other, and wherein the first and second parts of the first check line formed as the first wiring layer and the third parts of the first check line formed as the second wiring layer.

19. The device as claimed in claim 12, further comprising at least one third through-substrate via penetrates through the semiconductor substrate and is located in the first area.

20. The device as claimed in claim 12, wherein the first line further includes a fourth part extending in the first direction and fifth part extending in the second direction, the fourth part is disposed on an opposite side to the second part with respect to the first part, and the fifth part connecting the other end of the first part with one end of the fourth part, and the device further comprises a second through-substrate via penetrating through the semiconductor substrate and being located in a second area that is between the first and fourth parts of the first check line.

* * * * *